(12) United States Patent
Lee et al.

(10) Patent No.: US 6,657,572 B2
(45) Date of Patent: Dec. 2, 2003

(54) DIGITAL NOISE-SHAPING FILTER WITH REAL COEFFICIENTS AND METHOD FOR MAKING THE SAME

(76) Inventors: Ducksoo Lee, 402 Keukdong Building, 1101-14 Daelim-Don, Youngdungpo-Gu, Seoul (KR), 150-827; Yeongha Choi, 402 Keukdong Building, 1101-14 Daelim-Don, Youngdungpo-Gu, Seoul (KR), 150-827; Sejin Doo, 402 Keukdong Building, 1101-14 Daelim-Don, Youngdungpo-Gu, Seoul (KR), 150-827; Kyoungsoo Park, 402 Keukdong Building, 1101-14 Daelim-Don, Youngdungpo-Gu, Seoul (KR), 150-827; Koeng-Mo Sung, 402 Keukdong Building, 1101-14 Daelim-Don, Youngdungpo-Gu, Seoul (KR), 150-827

(*) Notice: Subject to any disclaimer, the term of this patent is extended or adjusted under 35 U.S.C. 154(b) by 2 days.

(21) Appl. No.: 10/069,340
(22) PCT Filed: Jun. 22, 2001
(86) PCT No.: PCT/KR01/01069
§ 371 (c)(1), (2), (4) Date: May 7, 2002
(87) PCT Pub. No.: WO01/99290
PCT Pub. Date: Dec. 27, 2001

(65) Prior Publication Data
US 2003/0086500 A1 May 8, 2003

(51) Int. Cl.[7] ................................................. H03M 3/00
(52) U.S. Cl. ........................ 341/143; 341/144; 341/141
(58) Field of Search ................................ 341/143, 144, 341/141

(56) References Cited

U.S. PATENT DOCUMENTS

| 5,581,253 | A | | 12/1996 | Brown |
| 5,990,818 | A | * | 11/1999 | McGrath ..................... 341/141 |
| 6,067,036 | A | * | 5/2000 | Mauthe et al. .............. 341/143 |
| 6,346,898 | B1 | * | 2/2002 | Melanson .................... 341/143 |
| 6,414,613 | B1 | * | 7/2002 | Midya et al. ................ 341/143 |
| 6,480,129 | B1 | * | 11/2002 | Melanson .................... 341/143 |

FOREIGN PATENT DOCUMENTS

JP 04 072907 3/1992

OTHER PUBLICATIONS

Raymond W. Zeng and Paul J. Hurst, A Comparison of Noise–Making Clock Generators for Switches–Capacitor Filters, 1996 IEEE, pps 77–80.
International Search Report—PCT/KR01/01069, Austrian Patent Office, Nov. 13, 2001.

* cited by examiner

Primary Examiner—Michael Tokar
Assistant Examiner—Lam Mai
(74) Attorney, Agent, or Firm—Harness, Dickey & Pierce, P.L.C.

(57) ABSTRACT

A digital noise-shaping filter with real coefficients for delta-sigma data converters used in a digital amplifier, 1-bit digital/analog converter, 1-bit analog/digital converter and the like, and a method for making the same. The present digital noise-shaping filter has improved noise suppression performance and system stability and reduced calculation complexity. To this end, the digital noise-shaping filter comprises a noise transfer function expressed by $NTF(z)=-1+a_1z^{-1}+a_2z^{-2}+\Lambda+a_Nz^{-N}$. The noise transfer function has optimum real coefficients or real coefficients approximating them.

21 Claims, 14 Drawing Sheets

DIGITAL NOISE-SHAPING FILTER WITH REAL COEFFICIENTS AND METHOD FOR MAKING THE SAME

CROSS REFERENCE TO RELATED APPLICATIONS

The disclosures in Korean Application No. 2000/34951, filed Jun. 23, 2000, and International Application No. PCT/KR01/01069, filed Jun. 22, 2001, are hereby incorporated by reference.

TECHNICAL FIELD

The present invention relates to a digital noise-shaping filter with real coefficients for delta-sigma data converters used in a digital amplifier, 1-bit digital/analog converter (DAC), 1-bit analog/digital converter (ADC) and the like, and a method for making the same.

BACKGROUND ART

The reasons for employing a conventional digital noise-shaping filter and problems with the digital noise-shaping filter are as follows.

1. Reasons for Employing Noise-Shaping Filter 1.1 Oversampling

Oversampling is typically used in a variety of technical fields such as a delta-sigma data converter, digital amplifier, etc. Oversampling means sampling of the original signal at a higher sampling rate than a normal sampling rate at which the original signal can be held and restored with no loss in information thereof. For example, assuming that an audio frequency band ranges from 20 Hz to 20 kHz, then sampling at the normal sampling rate signifies sampling of an audio signal at a minimum of about 40 kHz on the basis of the Nyquist sampling theorem. But, oversampling means sampling of the audio signal at a higher sampling rate than the minimum sampling rate based on the Nyquist sampling theorem. For example, 8-times (×8) oversampling is defined as sampling the above audio signal at a frequency of eight times the minimum sampling frequency, or on the order of 320 kHz (see FIG. 1).

In case oversampling is carried out as mentioned above, the signal and quantization noise have spectra varying as shown in FIG. 2. In FIG. 2, the signal is indicated by a solid line and the quantization noise is indicated by a dotted line. The reason why the spectra of the signal and quantization noise varies as shown in FIG. 2 is disclosed in most teaching materials related to discrete signal processing (see: Alan V. Oppenheim, Ronald W. Schafer with John R. Buck, DISCRETE-TIME SIGNAL PROCESSING 2nd ed. pp 201–213 (Prentice Hall Signal Processing Series, Upper Saddle River, N.J., 1999)).

It can be seen from FIG. 2 that a band that the signal occupies on the standard frequency axis owing to oversampling is reduced in width compared to that prior to oversampling in inverse proportion to an oversampling ratio. An appropriate low pass filter can be used to remove a great portion of noise from the signal having such a reduced bandwidth. A noise-shaping filter can also be used to still further reduce the amount of noise energy of the band where the signal exists, by changing the shape of noise distribution by bands.

FIG. 3 shows spectra of the signal and quantization noise shaped by the noise-shaping filter, wherein the signal is indicated by a solid line, the quantization noise before being shaped is indicated by a dotted, straight line, and the quantization noise after being shaped is indicated by a dotted, curved line. From comparison between the quantization noise before being shaped and the quantization noise after being shaped in FIG. 3, it can be seen that the quantization noise of the signal band is significantly reduced in amount owing to the noise shaping.

1.2 Pulse Width Moldulation (PWM) and Requantization

PWM is one of methods for expressing a quantized signal (see FIG. 4). In this PWM technique, each discrete signal has a fixed amplitude (an amplitude on the vertical axis in FIG. 4), which represents a physical amount such as a voltage, and a pulse width on the time axis, which varies in proportion to the magnitude of the original signal. An appropriate low pass filter can be used to restore the resulting modulated signal with both the original signal and harmonic components into the original signal. The PWM technique is used mostly in a digital amplifier, delta-sigma converter, etc.

Signal modulation by the PWM technique necessitates a signal processor that has a higher degree of precision on the time axis than a sampling frequency of the original signal, in that the magnitude of the original signal is expressed not by a pulse amplitude, but by a pulse width. For example, for quantization of a signal sampled at 44.1 kHz into a 16-bit signal, the signal processor is required to have a processing speed of $44.1 \text{ kHz} \times 2^{16} \approx 2.89$ GHz. In some cases, a frequency that is twice as high as the above processing speed may be used for quantization according to a given PWM mode.

Further, the PWM cannot help generating undesired harmonic components due to its inherent characteristics. In this regard, oversampling must be carried out to reduce the harmonic components, resulting in the precision on the time axis becoming a higher frequency than that in the above example. For example, for 8-times oversampling, the signal processor is required to have an operating frequency of about $2.89 \text{ GHz} \times 8 \approx 23.12$ GHz.

However, it is practically impossible to embody such a high-speed signal processor. For this reason, the resolution of quantization must be lowered to a smaller value than the 16-bit value in the above example, which is typically called requantization. A requantized signal has a greater error compared to the original signal, which is expressed as noise components of the original signal. A noise-shaping filter is used to compensate for such an error.

2. Noise-Shaping Filter

A noise-shaping filter functions to shape the spectrum of quantization noise in a delta-sigma data converter. FIG. 5 shows the structure of a conventional noise-shaping filter. In this conventional noise-shaping filter, a digital input signal $\hat{x}$ of b bits is quantized into an output signal $\hat{x}+e_{ns}$ of b' bits, where b' is smaller than b. The component $e_{ns}$ of the output signal is a noise component after the input signal is passed through the entire system. A component $e_{rq}$ is a difference between a signal before being quantized and a signal after being quantized. The noise-shaping filter can shape the quantization noise by passing such a signal difference through an appropriate filter, feeding the resulting value back to the input signal and adding it to the input signal. A transfer function of the appropriate filter is defined as H(z).

The noise-shaping filter acts to reduce noise components at a specific frequency band in question by appropriately shaping the spectrum of quantization noise. A noise transfer function of the noise-shaping filter of FIG. 5 can be defined as in the following equation 1.

$$NTF(z) \equiv \frac{E_{ns}(z)}{E_{rq}(z)} \qquad \text{[Equation 1]}$$

where, $E_{ns}(z)$ and $E_{rq}(z)$ are z-transforms of $e_{ns}$ and $e_{rq}$, respectively.

The noise transfer function can be derived from a conceptual diagram of FIG. 5 as in the below equation 2.

$$NTF(z) = H(z) - 1 \qquad \text{[Equation 2]}$$

The noise transfer function exerts an important effect on the performance of a conventional noise-shaping filter. The conventional noise-shaping filter has a noise transfer function expressed by the following equation 3.

$$NTF(z) = -(1-z^{-1})^N \qquad \text{[Equation 3]}$$

where, N is a natural number, which is an order of the filter.

For example, a noise transfer function of a second-order (order-2) filter can be obtained as in the below equation 4 by expanding the noise transfer function of the above equation 3.

$$NTF(z) = -1 + 2z^{-1} - z^{-2} \qquad \text{[Equation 4]}$$

Similarly, a noise transfer function of a third-order filter can be expressed as in the following equation 5.

$$NTF(z) = -1 + 3z^{-1} - 3z^{-2} + z^{-3} \qquad \text{[Equation 5]}$$

The below table 1 shows coefficients of respective terms in noise transfer functions of second-order to seventh-order filters for 8-times oversampling, where all constant terms are −1.

TABLE 1

| ORDER | 2nd | 3rd | 4th | 5th | 6th | 7th |
|---|---|---|---|---|---|---|
| $a_1$ | 2 | 3 | 4 | 5 | 6 | 7 |
| $a_2$ | −1 | −3 | −6 | −10 | −15 | −21 |
| $a_3$ |  | 1 | 4 | 10 | 20 | 35 |
| $a_4$ |  |  | −1 | −5 | −15 | −35 |
| $a_5$ |  |  |  | 1 | 6 | 21 |
| $a_6$ |  |  |  |  | −1 | −7 |
| $a_7$ |  |  |  |  |  | 1 |

As seen from the above equation 4, equation 5 and table 1, the coefficients of the noise transfer function of the conventional noise-shaping filter are integers (see: J. M. Goldberg, M. B. Sandler, Noise Shaping and Pulse-Width Modulation for an All-digital Audio Power Amplifier, J. Audio Eng. Soc., vol. 39 pp. 449–460 (June 1991)).

The conventional noise-shaping filter is desirably simple to construct because the coefficients of the respective terms in the noise transfer function thereof are simple integers, but has a disadvantage in that it cannot maximize noise suppression performance.

Further, the higher order of the noise transfer function results in an instability in the entire system although it is able to improve the performance of the conventional noise-shaping filter (see: Alan V. Oppenheim, Ronald W. Schafer with John R. Buck, DISCRETE-TIME SIGNAL PROCESSING 2nd ed. pp 201–213 (Prentice Hall Signal Processing Series, Upper Saddle River, N.J., 1999)). That is, the order of the filter cannot unconditionally increase in consideration of the system stability.

Accordingly, there is a need for a noise-shaping filter to minimize an instability of the entire system and use a noise transfer function capable of maximizing noise suppression performance, more particularly coefficients of the noise transfer function, or coefficients having values other than integers.

DISCLOSURE OF THE INVENTION

Therefore, the present invention has been made in view of the above problems, and it is an object of the present invention to provide a digital noise-shaping filter and a method for making the same, wherein respective coefficients of a noise transfer function of the noise-shaping filter are not simple integers, but appropriate real coefficients.

It is another object of the present invention to provide a digital noise-shaping filter having real coefficients capable of maximizing noise suppression performance, and a method for obtaining the real coefficients of the noise-shaping filter.

It is a further object of the present invention to provide a digital noise-shaping filter with real coefficients which shows excellent noise suppression performance over those of conventional noise-shaping filters in the same order, and a method for making the same.

It is another object of the present invention to provide a digital noise-shaping filter with real coefficients which is operable in a lower order than those of conventional noise-shaping filters to obtain the same noise suppression performance as those of the conventional noise-shaping filters, resulting in an increase in system stability, and a method for making the same.

It is yet another object of the present invention to provide a digital noise-shaping filter which has real coefficients approximating optimum values so that it can have almost the same performance as the optimum performance without increasing a calculation complexity, and a method for making the same.

In accordance with one aspect of the present invention, the above and other objects can be accomplished by the provision of a digital noise-shaping filter for a delta-sigma data converter, comprising a noise transfer function expressed by $NTF(z) = -1 + a_1 z^{-1} + a_2 z^{-2} + \Lambda + a_N z^{-N}$, the noise transfer function having real coefficients, where $NTF(z)$ is a z-transform of the noise transfer function, $a_1, a_2, \ldots, a_N$ are the real coefficients of the noise transfer function, and N is an order of the noise-shaping filter.

Preferably, the real coefficients of the noise transfer function may be obtained by 1) defining an objective function enabling a quantitative evaluation of the performance of the noise-shaping filter; 2) obtaining real coefficient conditions capable of optimizing the objective function; and 3) mathematically calculating optimum real coefficients satisfying the real coefficient conditions.

In accordance with another aspect of the present invention, there is provided a method for making a digital noise-shaping filter for a delta-sigma data converter, the digital noise-shaping filter comprising a noise transfer function expressed by $NTF(z) = -1 + a_1 z^{-1} + a_2 z^{-2} + \Lambda + a_N z^{-N}$, the noise transfer function having real coefficients $a_1, a_2, \ldots, a_N$, wherein the real coefficients of the noise transfer function are obtained by the steps of a) defining an objective function enabling a quantitative evaluation of the performance of the noise-shaping filter; b) obtaining real coefficient conditions capable of optimizing the objective function; and c) mathematically calculating optimum real coefficients satisfying the real coefficient conditions.

Preferably, the real coefficients of the noise transfer function may be values approximating the optimum real coefficients, and the approximate real coefficients may be values approximated to four or more decimal places by a binary number.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
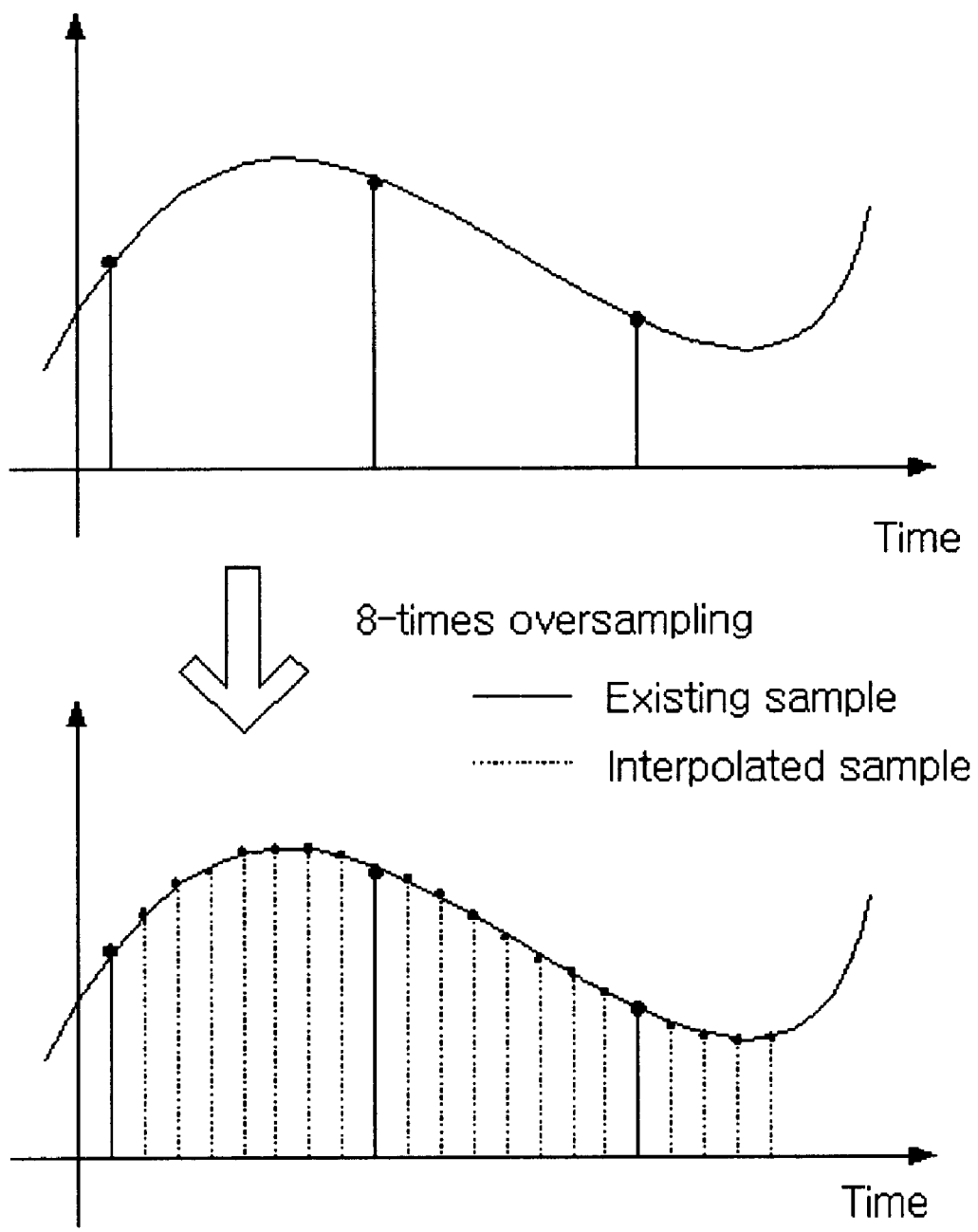
FIG. 1 is a conceptual diagram of general 8-times oversampling.
Figure 2:
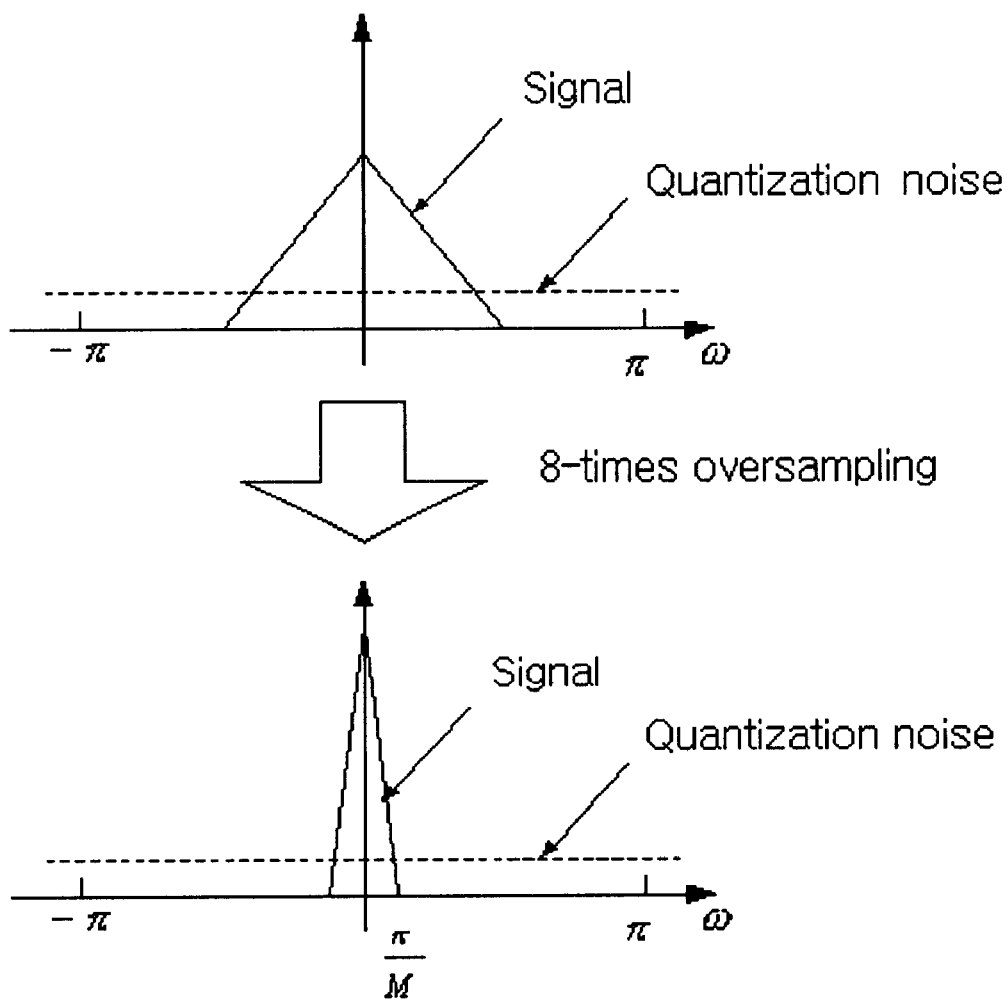
FIG. 2 is a conceptual diagram of 8-times oversampling in terms of frequency.
Figure 3:
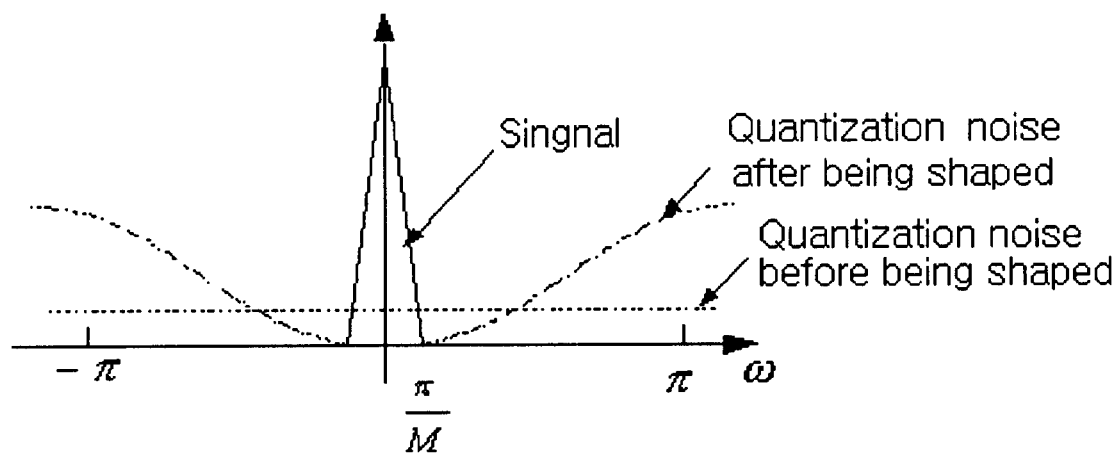
FIG. 3 is a conceptual diagram of noise shaping by a conventional noise-shaping filter.
Figure 4:
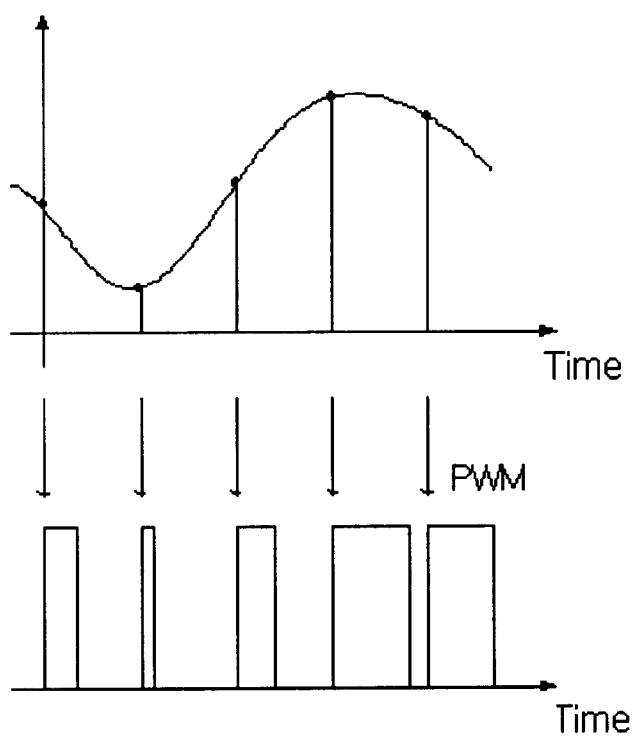
FIG. 4 is a conceptual diagram of PWM.
Figure 5:
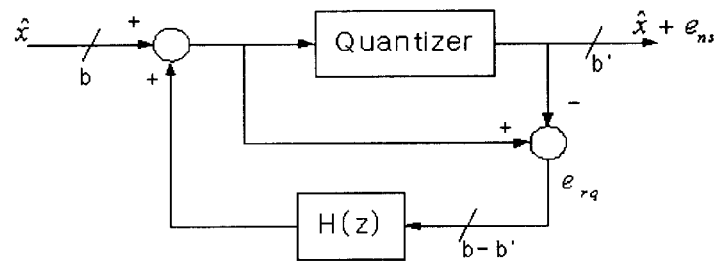
FIG. 5 is a conceptual diagram of the conventional noise-shaping filter.

1. Expressions of Noise Transfer Function of Digital Noise-Shaping Filter

A digital noise-shaping filter with real coefficients according to the present invention has a noise transfer function NTF(z) expressed in the following equation 6.

$$NTF(z) = -1 + \sum_{k=1}^{N} a_k z^{-k} \qquad \text{[Equation 6]}$$

where, N is an order of the noise transfer function and $a_k$ is a coefficient of the noise transfer function.

In this invention, coefficients of the noise transfer function are real coefficients. Expanding the right side of the above equation 6, the result is obtained as in the below equation 7.

$$NTF(z) = -1 + a_1 z^{-1} + a_2 z^{-2} + \Lambda + a_N z^{-N} \qquad \text{[Equation 7]}$$

2. Optimization of Real coefficients of Noise Transfer Function

Real coefficients of a noise transfer function can be optimized and approximated in the below manner.

1) Define an objective function enabling a quantitative evaluation of the performance of a noise-shaping filter.
2) Obtain conditions of real coefficients capable of optimizing the objective function.
3) Obtain optimum real coefficients of the noise-shaping filter by mathematically calculating optimum real coefficients satisfying the above conditions.

1) Definition of Objective Function for Quantitative Evaluation of Performance of Noise-Shaping Filter An objective function is defined as the ratio of the amount of energy of quantization noise before being shaped to the amount of energy of quantization noise after being shaped, at a frequency band of interest. A physical meaning of this definition is that a specific ratio represents a noise reduction degree.

The definition of the objective function is made in this specification for the first time. The objective function will hereinafter be referred to as a 'noise shaping gain', which can be expressed as in the following equation 8.

$$NSG \equiv 10 \log_{10} \frac{P_{rq}}{P_{ns}} \qquad \text{[Equation 8]}$$

where, NSG is a noise shaping gain, and $P_{ns}$ and $P_{rq}$ are powers of noise components $e_{ns}(n)$ and $e_{rq}(n)$ in the above equation 5, namely, powers in a signal band.

The noise components $e_{ns}(n)$ and $e_{rq}(n)$ are random signals. Power of each of the random signals can be defined as an expectation value of the square of each random signal. If a mean value of each random signal, or noise component, is '0', the expectation value of the square of each random signal is a variance. The powers of the noise components can be calculated with respect to a minimum quantization scale $\Delta$ as in the below equations 9 and 10, respectively.

$$P_{rq} = \xi\{e_{rq}^2[n]\} = \frac{1}{2\pi} \int_{-\frac{\pi}{M}}^{\frac{\pi}{M}} \sigma_e^2 d\omega = \frac{\sigma_e^2}{M} = \frac{\Delta^2}{12M} \qquad \text{[Equation 9]}$$

$$P_{ns} = \xi\{e_{ns}^2[n]\} = \frac{1}{2\pi} \int_{-\frac{\pi}{M}}^{\frac{\pi}{M}} \sigma_e^2 |NTF(e^{i\omega})|^2 d\omega \qquad \text{[Equation 10]}$$
$$= \frac{\Delta^2}{12M} \int_{-\frac{\pi}{M}}^{\frac{\pi}{M}} |NTF(e^{i\omega})|^2 d\omega$$

where, M is an oversampling ratio, $\sigma_e$ is a standard deviation of quantization errors and $\Delta$ is a minimum quantization scale.

Substituting the equations 9 and 10 into the equation 8, the result is:

$$NSG = 10\log_{10}\frac{1}{\int_{-\frac{\pi}{M}}^{\frac{\pi}{M}} |NTF(e^{j\omega})|^2 \, d\omega} \quad \text{[Equation 11]}$$

In the above equation 11, $NTF(e^{j\omega})$ is a Fourier transform of $NTF(z)$, which is defined as in the below equation 12.

$$NTF(e^{j\omega}) = |NTF(z)|_{z=e^{j\omega}} \quad \text{[Equation 12]}$$

For integration of the above equation 11, a more detailed description will hereinafter be given of an integrand in the right side of the equation 11.

Substituting the equation 7 into the integrand in the equation 11, the result is:

$$|NTF(e^{j\omega})|^2 = \left(-1 + \sum_{k=1}^{N} a_k z^{-k}\right) \cdot \left(-1 + \sum_{k=0}^{N} a_k z^k\right) \quad \text{[Equation 13]}$$

$$= (-1 + a_1 e^{-j\omega} + a_2 e^{-j2\omega} +$$
$$a_3 e^{-j3\omega} \Lambda a_N e^{-jN\omega}) \cdot (-1 + a_1 e^{+j\omega} +$$
$$a_2 e^{+j2\omega} + a_3 e^{+j3\omega} \Lambda a_N e^{-jN\omega})$$

Expanding the above equation 13, respective terms can be arranged about cos $K\omega$ (K=0, 1, 2, . . . , N) as in the following equation 14.

$$|NTF(e^{j\omega})|^2 = (1 + a_1^2 + a_2^2 + a_3^2 \Lambda a_N^2) + \quad \text{[Equation 14]}$$
$$2(-a_1 + a_1 a_2 + a_2 a_3 + \Lambda a_{N-1} a_N)\cos\omega +$$
$$2(-a_2 + a_1 a_3 + a_2 a_4 + \Lambda a_{N-2} a_N)\cos 2\omega +$$
$$2(-a_3 + a_1 a_4 + a_2 a_5 + \Lambda a_{N-3} a_N)\cos 3\omega + \Lambda +$$
$$2(-a_{N-1} + a_1 a_N)\cos(N-1)\omega + 2(-a_N)\cos N\omega$$

Substituting the above equation 14 into the integrand in the equation 11, the resulting integrand can be expressed as in the below equation 15.

$$\int_{-\frac{\pi}{M}}^{\frac{\pi}{M}} |NTF(e^{j\omega})|^2 \, d\omega = (1 + a_1^2 + a_2^2 + a_3^2 \Lambda a_N^2)\frac{2\pi}{M} + \quad \text{[Equation 15]}$$
$$4(-a_1 + a_1 a_2 + a_2 a_3 + \Lambda a_{N-1} a_N)\sin\frac{\pi}{M} +$$
$$\frac{4}{2}(-a_2 + a_1 a_3 + a_2 a_4 + \Lambda a_{N-2} a_N)\sin\frac{2\pi}{M} +$$
$$\frac{4}{3}(-a_3 + a_1 a_4 + a_2 a_5 + \Lambda a_{N-3} a_N)\sin\frac{2\pi}{M} +$$
$$\Lambda + \frac{4}{(N-1)}(-a_{N-1} + a_1 a_N)\sin\frac{(N-1)\pi}{M} +$$
$$\frac{4}{N}(-a_N)\sin\frac{N\pi}{M} \equiv NSG^*$$

2) Conditions of Real Coefficients for Optimization of Objective Function

The above equation 11 defining the objective function is in the form of a logarithmic function of a reciprocal of an integral function. In this connection, a condition where the objective function becomes a maximal value is equal to a condition where the integral function thereof becomes a minimal value.

The objective function of the equation 11 is a function of several variables for real coefficients $a_k$ and the integral function thereof is a function of several variables for the real coefficients $a_k$, too. As seen from the above equation 15, the integral function increases infinitely positively with regard to the respective real coefficients $a_k$. In this connection, provided that there is one extreme value at which all differential quotients for the respective real coefficients are 0, the integral function will become the minimal value and the objective function will become the maximal value. That the objective function becomes the maximal value means that the noise shaping gain becomes the maximal value. Accordingly, the extreme value, or the minimal value, is obtained by defining the integral function of the objective function as the auxiliary function NSG* as in the equation 15 and partially differentiating it.

The following equation 16 expresses a condition where the auxiliary function NSG* is partially differentiated with regard to the respective real coefficients and the resulting partial differential quotients become '0'.

$$\frac{\partial(NSG^*)}{\partial a_k} = 0 \quad (\text{where, } \kappa = 1, 2, 3, \Lambda, N) \quad \text{[Equation 16]}$$

Substituting the equation 15 defining the auxiliary function NSG* into the above equation 16 and expanding the resulting equation with respect to $\kappa=1$, the result is:

$$\frac{\partial(NSG^*)}{\partial a_1} = \frac{4\pi}{M}a_1 - 4\sin\frac{\pi}{M} + 4\left(\sin\frac{\pi}{M}\right)a_2 + \quad \text{[Equation 17]}$$
$$\frac{4}{2}\left(\sin 2\frac{\pi}{M}\right)a_3 + \Lambda \frac{4}{(N-1)}\left(\sin(N-1)\frac{\pi}{M}\right)a_N$$
$$= 0$$

Expanding the resulting equation with respect to $\kappa=2$, the result is:

$$\frac{\partial(NSG^*)}{\partial a_2} = \frac{4\pi}{M}a_2 + 4\left(\sin\frac{\pi}{M}\right)a_1 - \frac{4}{2}\sin\frac{2\pi}{M} + \quad \text{[Equation 18]}$$
$$\frac{4}{2}\left(\sin\frac{2\pi}{M}\right)a_4 + \Lambda + \frac{4}{(N-2)}$$
$$\left(\sin\frac{(N-2)\pi}{M}\right)a_N$$
$$= 0$$

N condition equations generated by expanding the resulting equation up to $\kappa=N$ can be simply expressed by the following equation 19, which is a determinant.

$$GA = B \quad \text{[Equation 19]}$$

where, A is an order-N column vector of the real coefficients, G is an N×N matrix of constants and B is an order-N column vector of differential quotients of the auxiliary function NSG* with regard to the respective real coefficients.

A and B in the above equation 19 can be expressed by the following equations 20 and 21, respectively.

$$A = \begin{pmatrix} a_1 \\ a_2 \\ a_3 \\ M \\ a_N \end{pmatrix}$$ [Equation 20]

$$B = \begin{pmatrix} b_1 \\ b_2 \\ b_3 \\ M \\ b_N \end{pmatrix}$$ [Equation 21]

Respective terms $b_i$, (i=0~N) of the order-N column vector B can be given as in the below equation 22.

$$b_i = \frac{4}{i} \sin i \frac{\pi}{M}$$ [Equation 22]

The matrix G can be expressed by the following equation 23 and respective elements thereof can be simply expressed as in the below equation 24.

$G = \{g_{ij}\}$ [Equation 23]

$$= \begin{bmatrix} \frac{4\pi}{M} & \frac{4}{1}\sin\frac{\pi}{M} & \frac{4}{2}\sin\frac{2\pi}{M} & \Lambda & \frac{4}{N-1}\sin(N-1)\frac{\pi}{M} \\ \frac{4}{1}\sin\frac{\pi}{M} & \frac{4\pi}{M} & \frac{4}{1}\sin\frac{\pi}{M} & \Lambda & \frac{4}{N-2}\sin(N-2)\frac{\pi}{M} \\ M & M & M & & M \\ \frac{4}{N-1}\sin(N-1)\frac{\pi}{M} & \frac{4}{N-2}\sin(N-2)\frac{\pi}{M} & \Lambda & & \frac{4\pi}{M} \end{bmatrix}$$

$$g_{ij} = \begin{cases} \frac{4\pi}{M} & (i = j) \\ \frac{4}{(j-i)}\sin(j-i)\frac{\pi}{M} & (i \neq j, j > i) \\ g_{ij} & (i \neq j, j < i) \end{cases}$$ [Equation 24]

where, M is an oversampling ratio.

The below equation 25 can be obtained by obtaining an inverse matrix of the matrix G and multiplying both sides of the equation 19 by the obtained inverse matrix. Then, all optimum real coefficients $a_K$ can be obtained by arranging the right side of the equation 25.

$A = G^{-1}B$ [Equation 25]

By defining the objective function and obtaining the conditions of real coefficients capable of optimizing the objective function, as stated above, the optimum real coefficients can be calculated with respect to any oversampling ratio or any order of the noise transfer function, thereby making the optimum noise-shaping filter.

2.1) Optimum Real Coefficients for 8-Times Oversampling

As stated previously, all coefficients of a noise transfer function of a conventional noise-shaping filter are integers as shown in the table 1. The below table 2 shows optimum real coefficients of second-order to seventh-order noise transfer functions obtained for 8-times oversampling by a method for making a noise-shaping filter according to the present invention. In the present method, the equations 22, 24 and 25 are programmed in a typical calculator, for example, a computer to input a predetermined oversampling ratio M of the noise-shaping filter and a predetermined order N of the noise transfer function and automatically calculate the optimum real coefficients on the basis of the inputted oversampling ratio M and order N. This program or programming technique is implemented in a typical manner.

TABLE 2

| ORDER | 2nd | 3rd | 4th | 5th | 6th | 7th |
|---|---|---|---|---|---|---|
| $\alpha_1$ | 1.9290 | 2.8891 | 3.8502 | 4.8116 | 5.7732 | 6.7350 |
| $\alpha_2$ | -0.9795 | -2.8703 | -5.6846 | -9.4235 | -14.0874 | -19.6767 |
| $\alpha_3$ | | 0.9802 | 3.8129 | 9.3872 | 18.5927 | 32.3201 |
| $\alpha_4$ | | | -0.9805 | -4.7559 | -13.9971 | -32.2316 |
| $\alpha_5$ | | | | 0.9806 | 5.6991 | 19.5151 |
| $\alpha_6$ | | | | | -0.9807 | -6.6427 |
| $\alpha_7$ | | | | | | 0.9807 |

Although coefficient values are shown in the above table 2 to only four decimal places on account of limited space, those skilled in the art will appreciate that the coefficient values can be calculated in more detail from the above-described equations.

FIGS. 6 to 11 show noise transfer characteristics-by-orders of the optimum noise-shaping filter implemented for the 8-times oversampling on the basis of the coeffients of the table 2. In each drawing, the abscissa represents a frequency normalized into a digital signal, and the ordinate represents the level of suppressed noise. The level 0 dB on the ordinate represents noise, not suppressed at all. The lower level on the ordinate indicates better performance because a larger amount of noise is suppressed. A dotted line indicates characteristics of a conventional noise-shaping filter and a solid line indicates characteristics of a proposed noise-shaping filter. A one-dot chain line so overlapping the solid line as to be difficult to distinguish it from the solid line indicates characteristics of a noise-shaping filter having optimum real coefficients whose decimal places are approximated by a 16-bit binary number, as will be described in "3. APPROXIMATION OF OPTIMUM REAL COEFFICIENTS OF NOISE TRANSFER FUNCTION". The noise transfer function of the noise-shaping filter approximating the optimum value so closely overlaps the optimum value as to be indistinguishable from it.

Figure 6:
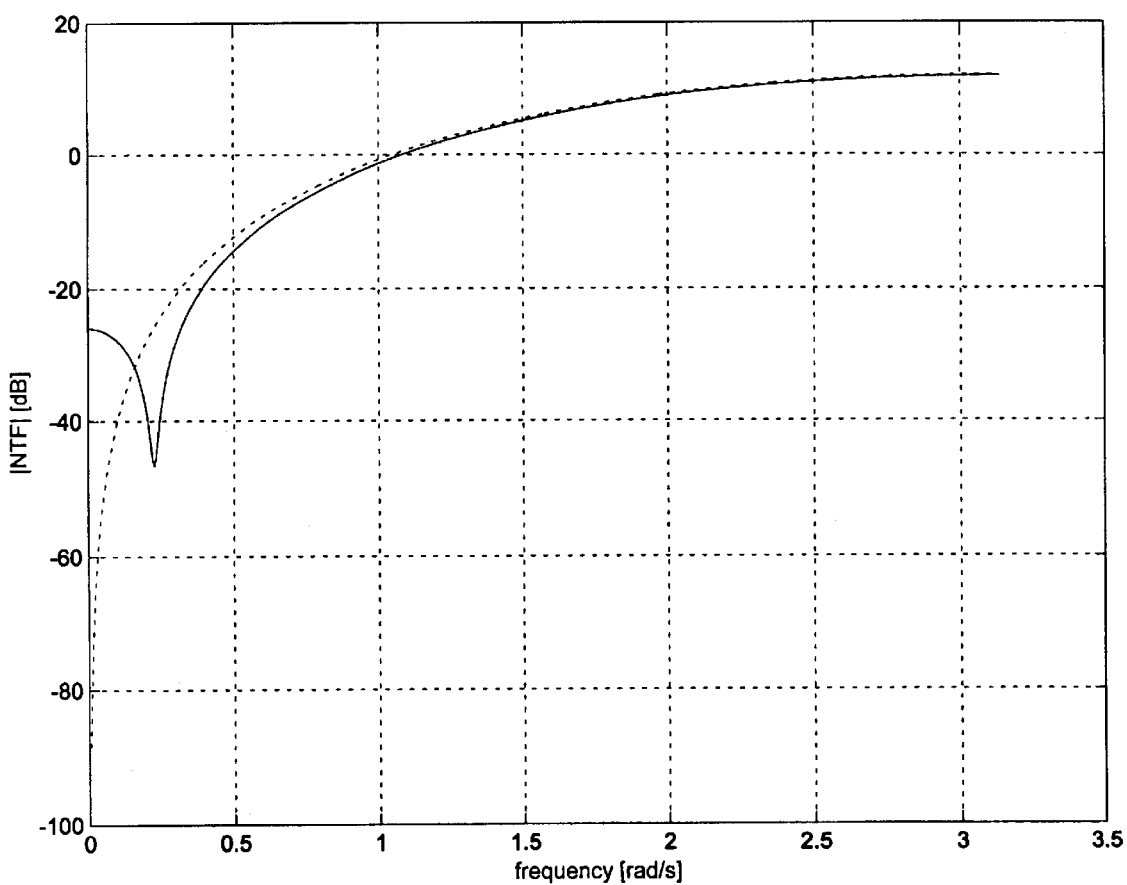
FIG. 6 is a graph showing a noise shaping gain of a second-order noise-shaping filter in accordance with the present invention.
Figure 7:
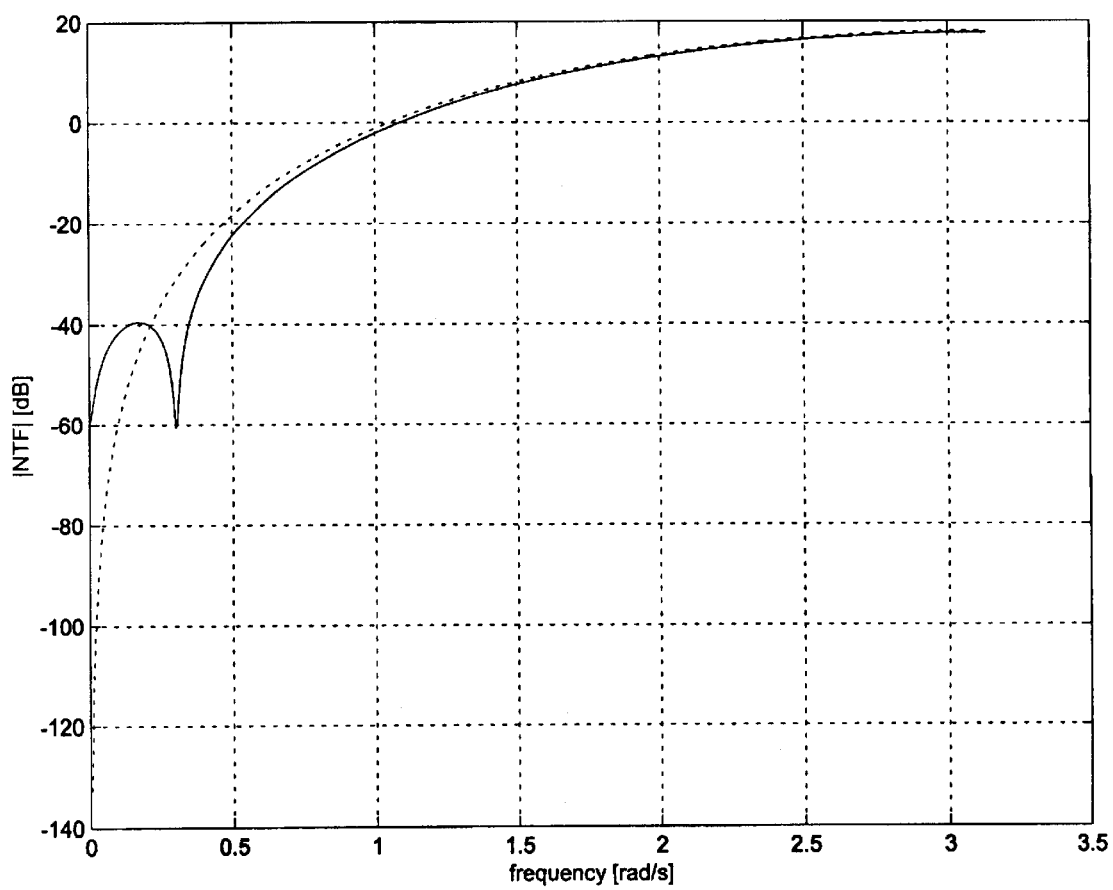
FIG. 7 is a graph showing a noise shaping gain of a third-order noise-shaping filter in accordance with the present invention.
Figure 8:
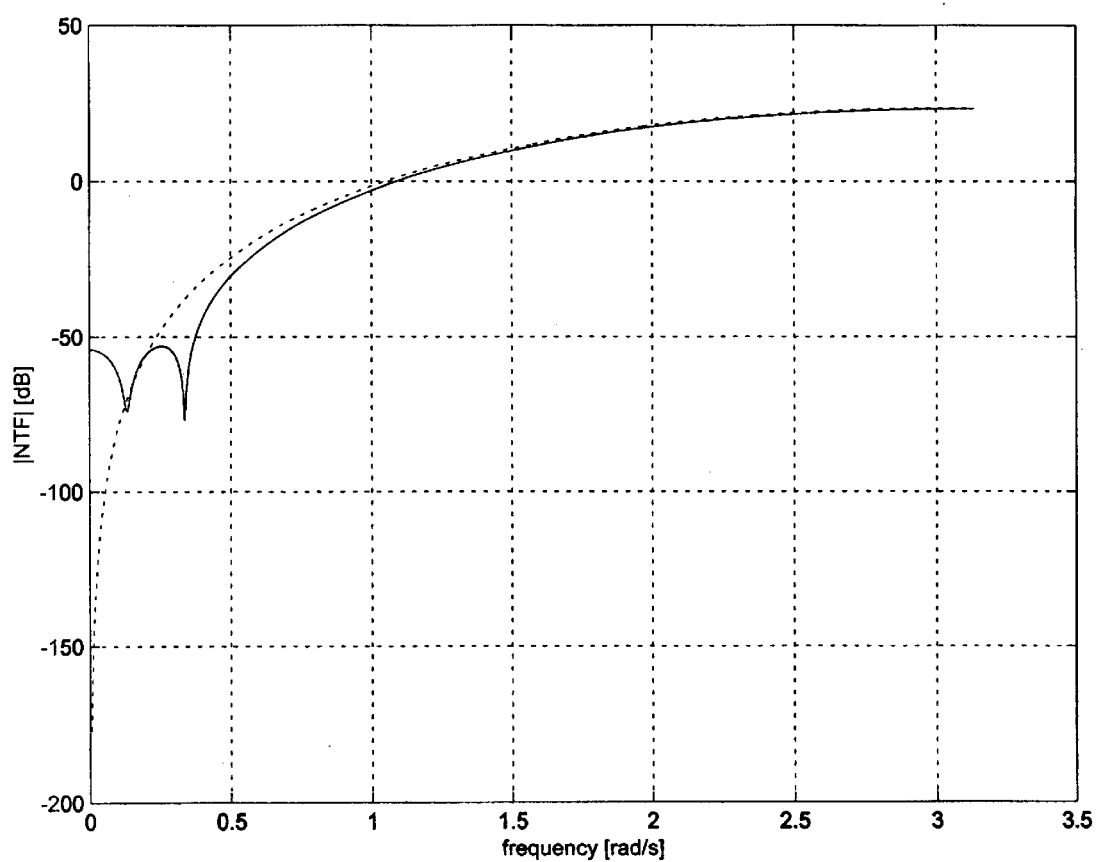
FIG. 8 is a graph showing a noise shaping gain of a fourth-order noise-shaping filter in accordance with the present invention.
Figure 9:
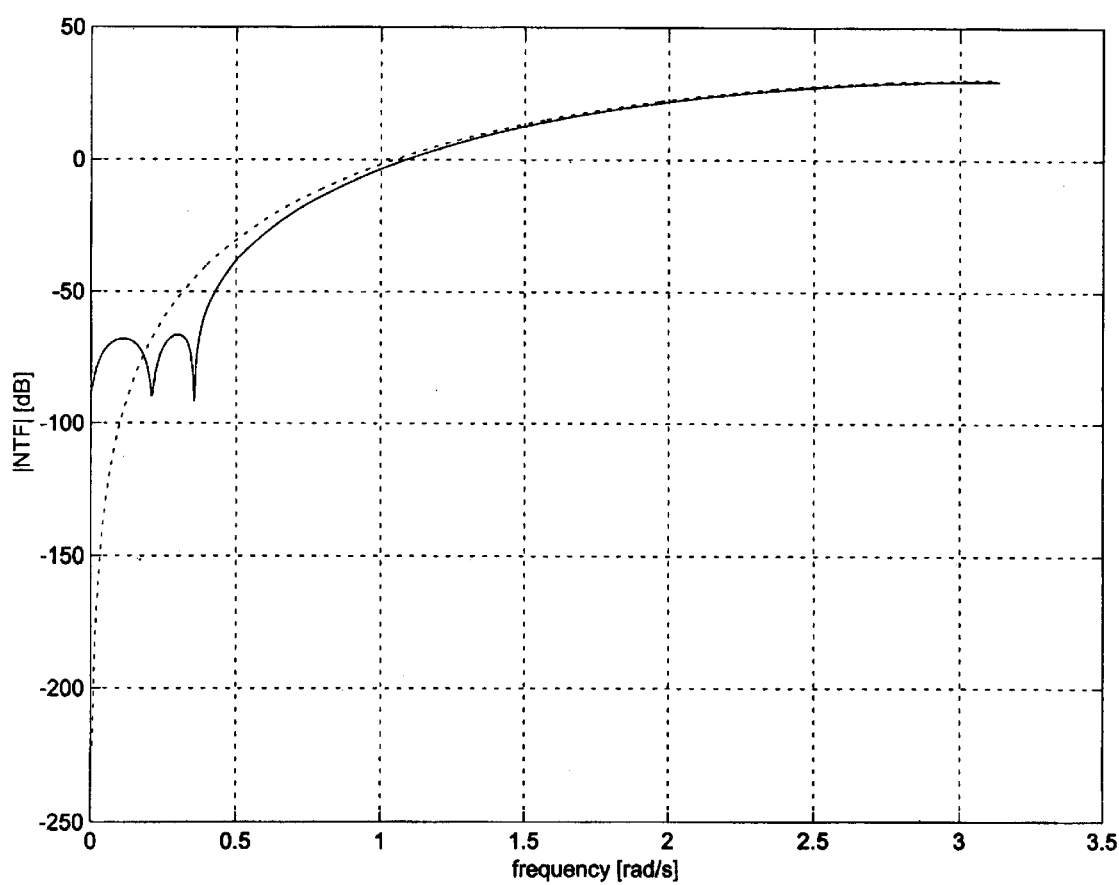
FIG. 9 is a graph showing a noise shaping gain of a fifth-order noise-shaping filter in accordance with the present invention.
Figure 10:
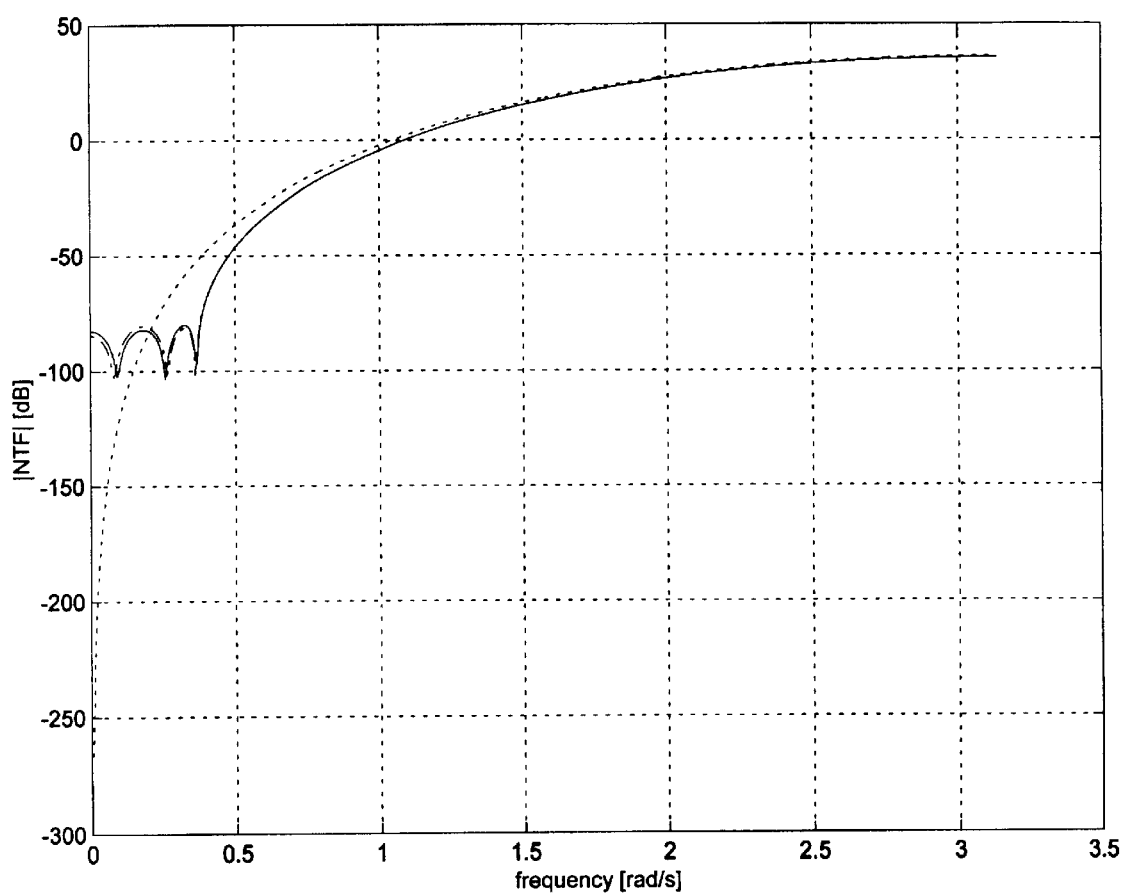
FIG. 10 is a graph showing a noise shaping gain of a sixth-order noise-shaping filter in accordance with the present invention.
Figure 11:
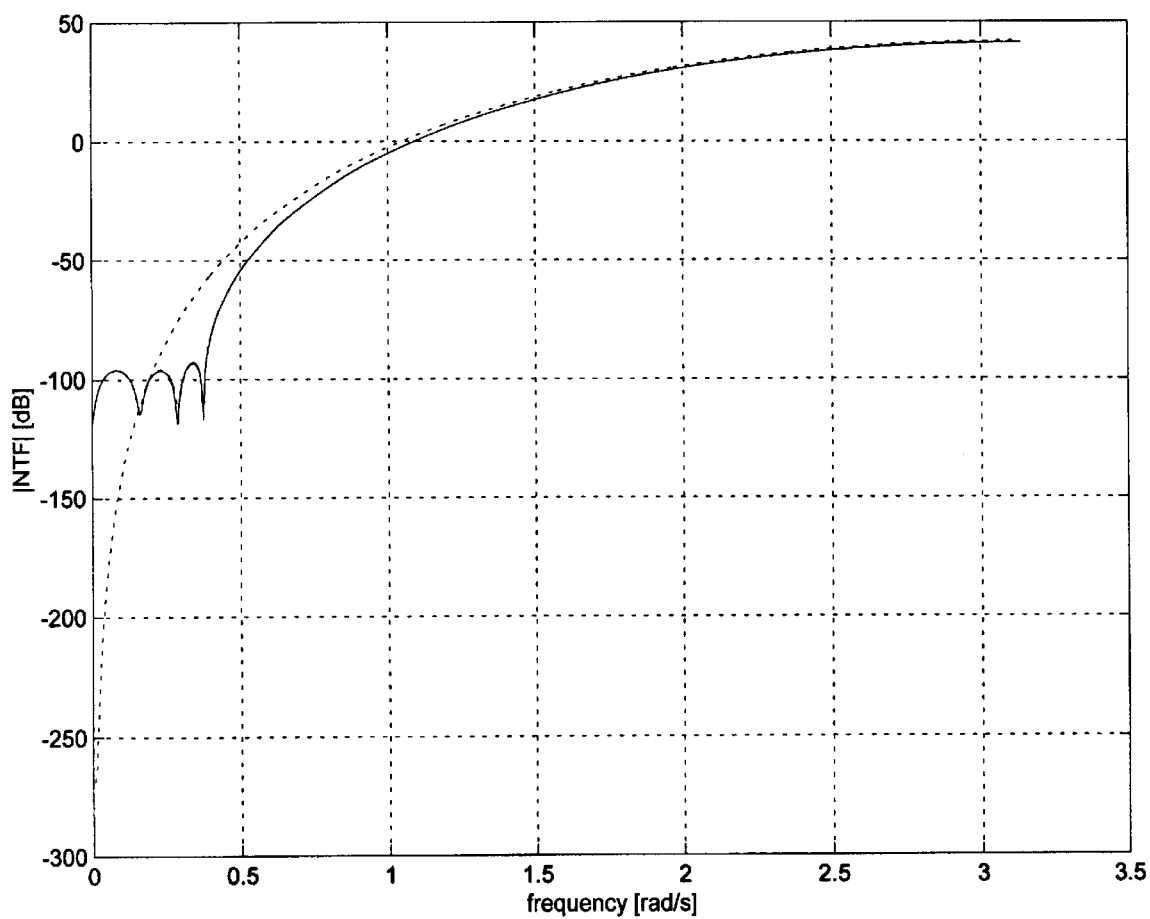
FIG. 11 is a graph showing a noise shaping gain of a seventh-order noise-shaping filter in accordance with the present invention.

FIG. 6 is a graph showing a second-order noise transfer function of the proposed noise-shaping filter, expressible by the equation 6 or 7. In this drawing, the oversampling ratio is 8 times. On the abscissa of the graph, an area below $8/\pi \approx 0.3927$ is an audio frequency band or a frequency band of interest, where the smaller the value of the noise transfer function becomes, the better the noise suppression performance becomes. It can be seen from a curved line in FIG. 6 that the optimized noise-shaping filter and the noise-shaping filter approximating it have smaller noise transfer function values than that of the conventional noise-shaping filter on the whole. Although the optimized noise-shaping filter has a greater noise transfer function value than that of the conventional noise-shaping filter in a part of the frequency band of interest, it has a greater noise suppression gain corresponding to the overall result than that of the conventional noise-shaping filter, as shown in the below table 3. The optimized noise-shaping filter further has a smaller noise transfer function value than that of the conventional noise-shaping filter even in an area beyond the audio frequency band or frequency band of interest.

FIGS. 7 to 11 are graphs showing third-order to seventh-order noise transfer functions of the proposed noise-shaping filter, which have substantially the same characteristics as those of FIG. 6 and a detailed description thereof will thus be omitted. In conclusion, it can be seen from the respective drawings that the proposed noise-shaping filter has significantly improved characteristics at the audio frequency band.

The below table 3 shows a comparison between the conventional noise-shaping filter and the digital noise-shaping filter with real coefficients according to the present invention with regard to the noise shaping gain defined in the equation 8.

TABLE 3

|  | 2nd | 3rd | 4th | 5th | 6th | 7th |
|---|---|---|---|---|---|---|
| CONVENTIONAL FILTER (1) | 24.4 | 34.0 | 43.2 | 52.3 | 61.2 | 70.0 |
| PROPOSED OPTIMUM FILTER (2) | 27.9 | 42.0 | 56.1 | 70.3 | 84.5 | 98.6 |
| (2)-(1) | 3.6 | 8.0 | 12.9 | 18.0 | 23.3 | 28.6 |

Figure 12:
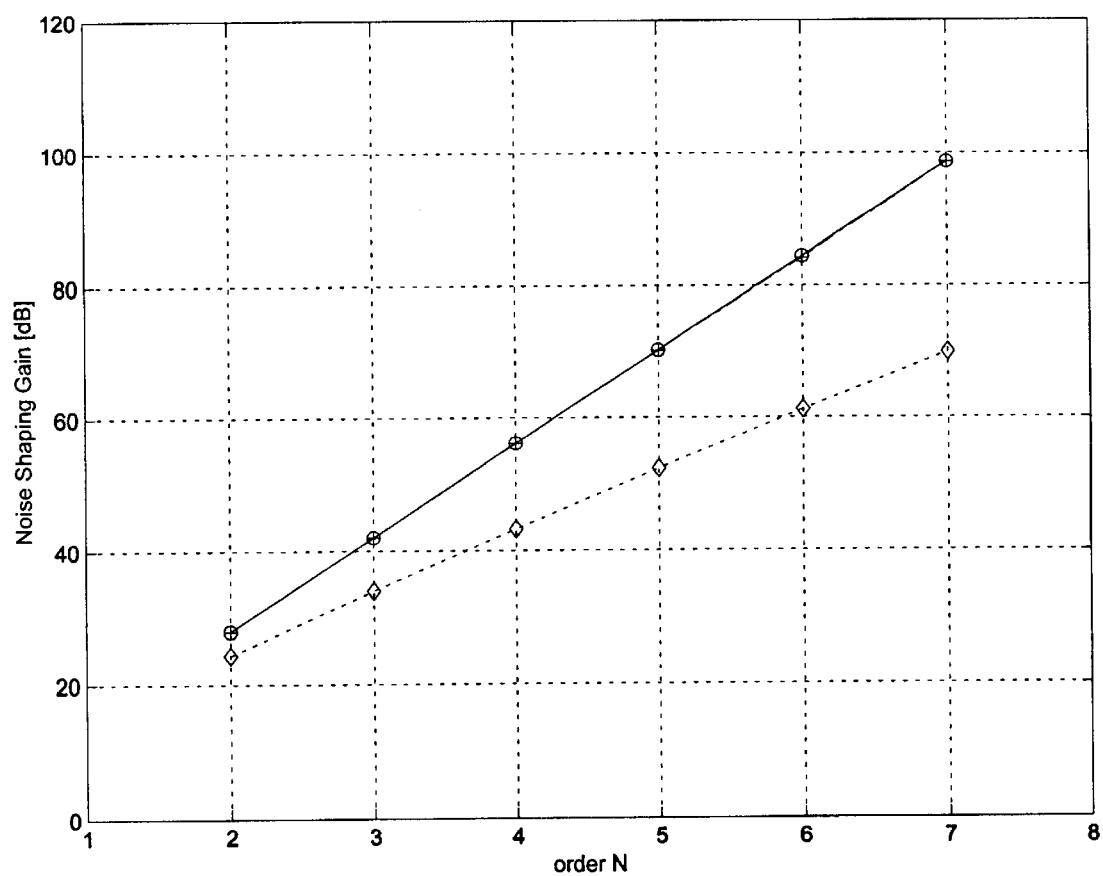
FIG. 12 is a graph showing an order-based noise shaping gain of a digital noise-shaping filter in accordance with the present invention.

FIG. 12 is a graph showing the results of the above table 3. In this drawing, a symbol ◊ indicates the noise shaping gain of the conventional noise-shaping filter and a symbol ○ indicates the noise shaping gain of the optimum noise-shaping filter. A curved line marked with "+" signs indicates a noise shaping gain of a noise-shaping filter having real coefficients whose decimal places are approximated by a 16-bit binary number, as will be described in "3. APPROXIMATION OF OPTIMUM REAL COEFFICIENTS OF NOISE TRANSFER FUNCTION". It is impossible to distinguish a curved line indicative of an optimum noise shaping gain and a curved line indicative of an approximate noise shaping gain from each other because they nearly overlap each other.

As seen from the graph of FIG. 12, the digital noise-shaping filter with the optimum real coefficients according to the present invention has excellent noise shaping gain and noise suppression characteristics over the conventional noise-shaping filter. It can also be seen from this drawing that, as the noise-shaping filter becomes lower in order, it more simply approximates the optimized noise-shaping filter and has a smaller performance difference from the optimized noise-shaping filter.

3. Approximation of Optimum Real Coefficients of Noise Transfer Function

1) Approximation of Real Coefficients of Second-Order Noise-Shaping Filter

The present invention provides an approximation method capable of implementing an optimum real-coefficient noise-shaping filter which has noise suppression performance approximating that of the optimum noise-shaping filter and is higher in calculation speed than the optimum noise-shaping filter.

Figure 13:
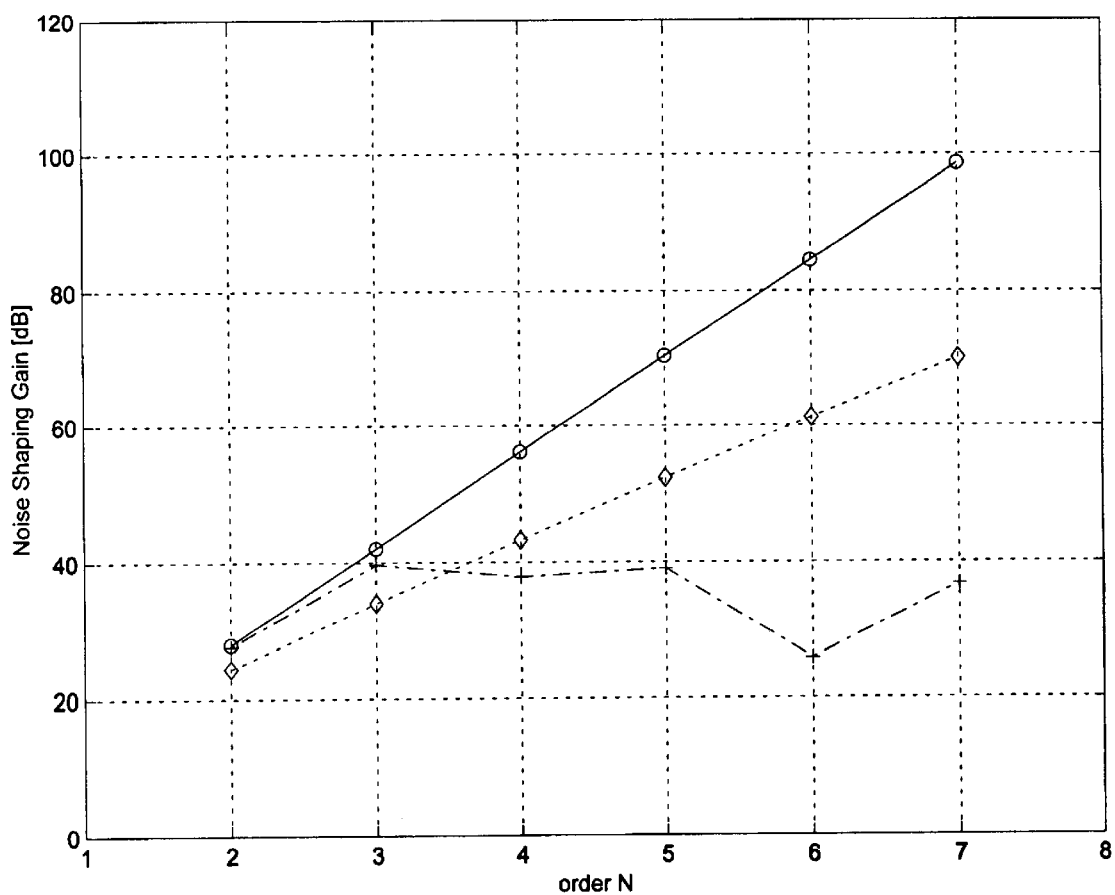
FIG. 13 is a graph showing a noise shaping gain of a second-order noise-shaping filter whose real coefficients are approximated to only four decimal places by a binary number.

FIG. 13 is a graph showing a noise shaping gain of a second-order noise-shaping filter whose real coefficients are approximated to only four decimal places by a binary number. In this drawing, a dotted line indicates a noise transfer function of a conventional noise-shaping filter and a solid line indicates a noise transfer function of an optimized noise-shaping filter. A one-dot chain line indicates a noise transfer function of a noise-shaping filter having real coefficients whose four decimal places are approximated by a binary number. From comparison between FIG. 13 and FIG. 6, it can be seen that the noise-shaping filter having the noise transfer function with the approximated real coefficients is implemented more simply than the noise-shaping filter having the noise transfer function with the optimized real coefficients and has characteristics almost analogous to those of the noise-shaping filter with the optimized real coefficients. The approximated real coefficients of the noise-shaping filter can be expressed by the below equations 26 and 27, respectively.

$$a_1 = 1.9290 = 2 - (1 - 0.9290) = \quad \text{[Equation 26]}$$
$$2 - 0.0710 = 10_{(2)} - 0.000100\Lambda_{(2)} \rightarrow a_1 =$$
$$10_{(2)} - 0.0001_{(2)} = 2 - \frac{1}{16} = 1.9375$$

$$a_2 = -1.0 \quad \text{[Equation 27]}$$

As seen from the above equation 26, each real coefficient can be approximated by binary decimals of 4 bits by (1) dividing the original real coefficient into a larger integer (2 in the equation 26) than the original real coefficient and decimals (0.0710 in the equation 26), (2) expressing the integer and decimals respectively as binary numbers (in the equation 26, the binary integer is $10_{(2)}$ and the binary decimals are $0.000100\ldots_{(2)}$), (3) taking only 4 bits of the binary decimals ($0.0001_{(2)}$ in the equation 26) and (4) expressing a value approximated by the binary decimals of 4 bits as a decimal number (1.9375 in the equation 26).

The noise-shaping filter can obtain a coefficient $a_1$ in the equation 26 by performing only one-time shifting and addition by an adder or subtracter without using a multiplier.

Figure 14:
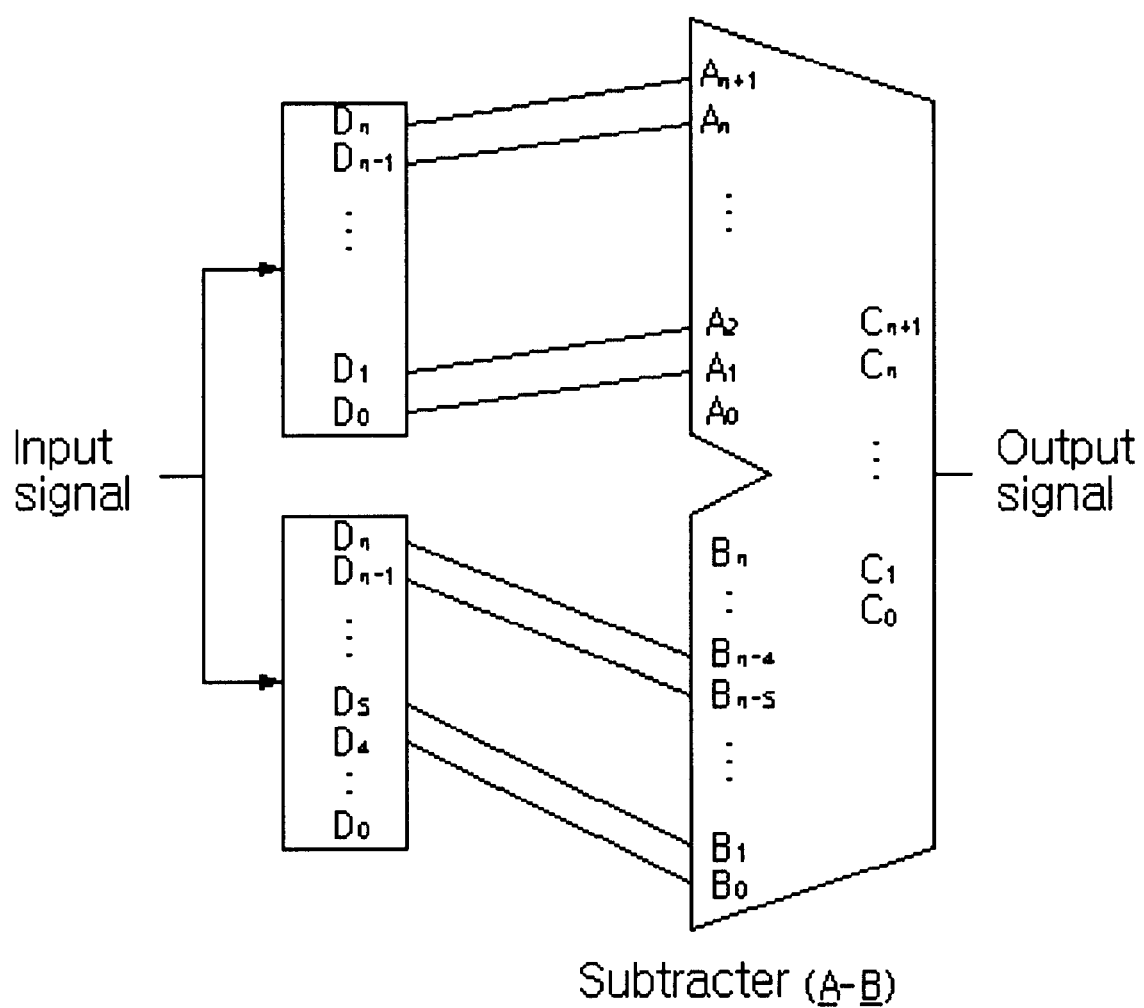
FIG. 14 is a conceptual diagram of an apparatus for approximating an optimum real coefficient of the first term of a second-order noise-shaping filter for 8-times oversampling.

FIG. 14 is a conceptual diagram of an apparatus for approximating an optimum real coefficient of the first term of a second-order noise-shaping filter for 8-times oversampling. It is common practice that an adder or subtracter is simpler in construction and higher in calculation speed than a multiplier.

The multiplication of a coefficient $a_2$ can be more simply performed by changing only a sign. Calculating a noise shaping gain on the basis of such a simple calculation, the result is:

$$NSG = 27.6[\text{dB}] \quad \left( a_1 = 1.9375 = 2 - \frac{1}{16}, a_2 = -1.0 \right) \quad \text{[Equation 28]}$$

This noise shaping gain is improved by 3.3 dB over the conventional second-order noise-shaping filter (NSG=24.3) shown in the table 3, and has a fine difference of only 0.3 dB from that of the optimized second-order filter (NSG=27.9).

It should be noted herein that the method for approximating real coefficients of the noise transfer function of the noise-shaping filter according to the present invention is also applicable to a third-order or higher-order noise-shaping filter.

2) Approximation of Real Coefficients of Third-Order Noise-Shaping Filter

For a third-order noise-shaping filter, real coefficients can be approximated appropriately in the same manner as those of the second-order noise-shaping filter. By expressing ideal coefficients $a_1$ and $a_2$ to only four decimal places as binary numbers, the coefficients $a_1$ and $a_2$ can be approximated as in the below equations 29 and 30, respectively.

$$a_1 = -2.8891 \to a_1 \approx 2.8750 = 3 - \frac{1}{8} \qquad \text{[Equation 29]}$$

$$a_2 = -2.8703 \to a_2 \approx -2.8750 = -\left(3 - \frac{1}{8}\right) \qquad \text{[Equation 30]}$$

It can be seen from the above approximate values that the coefficient multiplication can be carried out by a simple and rapid hardware configuration in a similar manner to the second-order noise-shaping filter. The below table 4 shows a noise shaping gain of a conventional third-order noise-shaping filter, a noise shaping gain of an optimized third-order noise-shaping filter and a noise shaping gain of a third-order noise-shaping filter having real coefficients whose decimal places are approximated by 4 bits. As seen from FIG. 13, however, a fourth-order or higher-order noise-shaping filter having real coefficients whose decimal places are approximated by 4 bits has a smaller noise shaping gain than that of a conventional fourth-order or higher-order noise-shaping filter. In this regard, for 4-bit approximation, it is preferred that the order of the noise-shaping filter is three or less.

TABLE 4

| FILTER TYPE | NOISE SHAPING GAIN | IMPROVED GAIN | DIFFERENCE FROM OPTIMUM VALUE |
|---|---|---|---|
| CONVENTIONAL | 34.0 dB | | |
| OPTIMUM | 42.0 dB | 8.0 dB | |
| APPROXIMATION OF DECIMAL PLACES BY 4 BITS | 39.6 dB | 5.6 dB | -2.4 dB |

3) Approximation of Real Coefficients of Nth-Order Noise-Shaping Filter

Although the above approximations have been disclosed for illustrative purposes with respect to the second-order and third-order noise-shaping filters, it should be noted herein that the method for approximating real coefficients of the noise transfer function of the noise-shaping filter according to the present invention is not limited to only the second-order and third-order noise-shaping filters. Those skilled in the art will readily appreciate from an item about a filter approximating an optimum filter (approximation by binary 4 bits) in the below table 5 that the method for approximating real coefficients of the noise transfer function of the noise-shaping filter according to the present invention is also applicable to noise-shaping filters of all orders such as order 4, order 5, order 6, order 7, etc.

4) Range of Bits for Binary Approximation

The approximation by binary 4 bits has been described as an example. It should be noted herein that this invention is not limited to the 4-bit approximation and is applicable to any number of bits for binary approximation, such as more than 4 bits, for example, 8 bits, 16 bits, etc.

Figure 15:
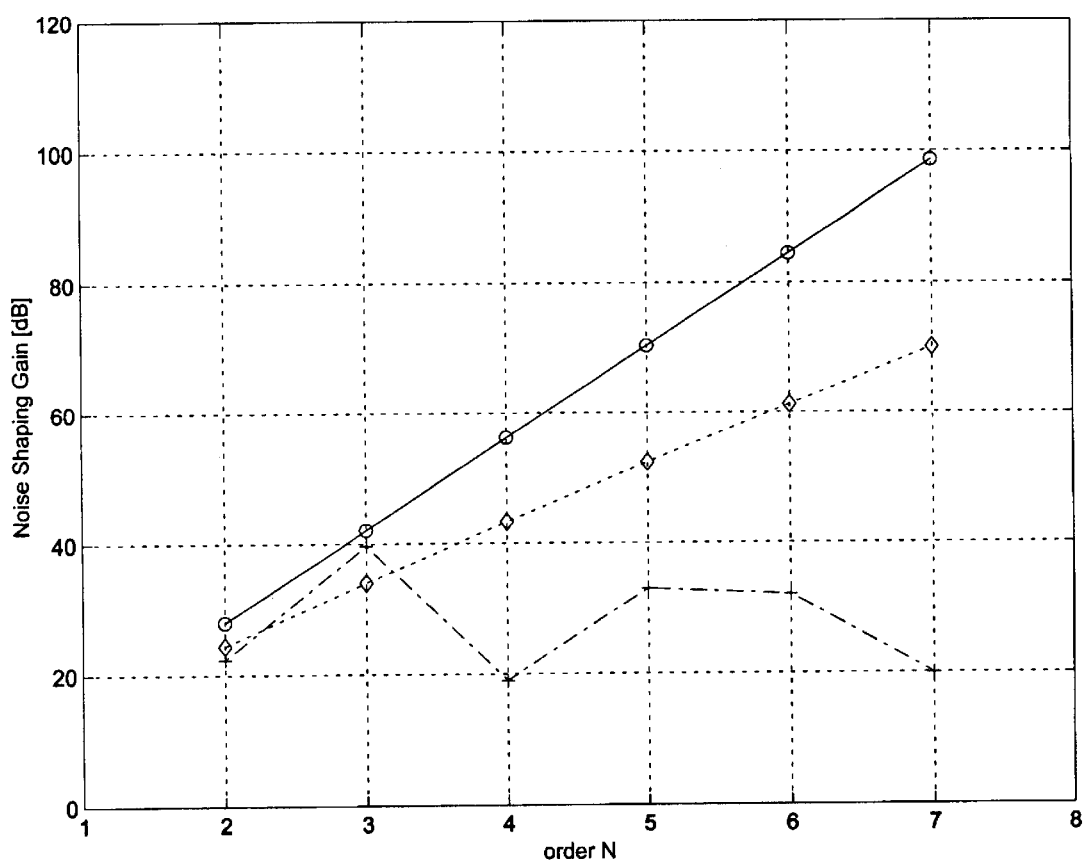
FIG. 15 is a graph showing a noise shaping gain of a second-order noise-shaping filter whose real coefficients are approximated to two decimal places by a binary number.
Figure 16:
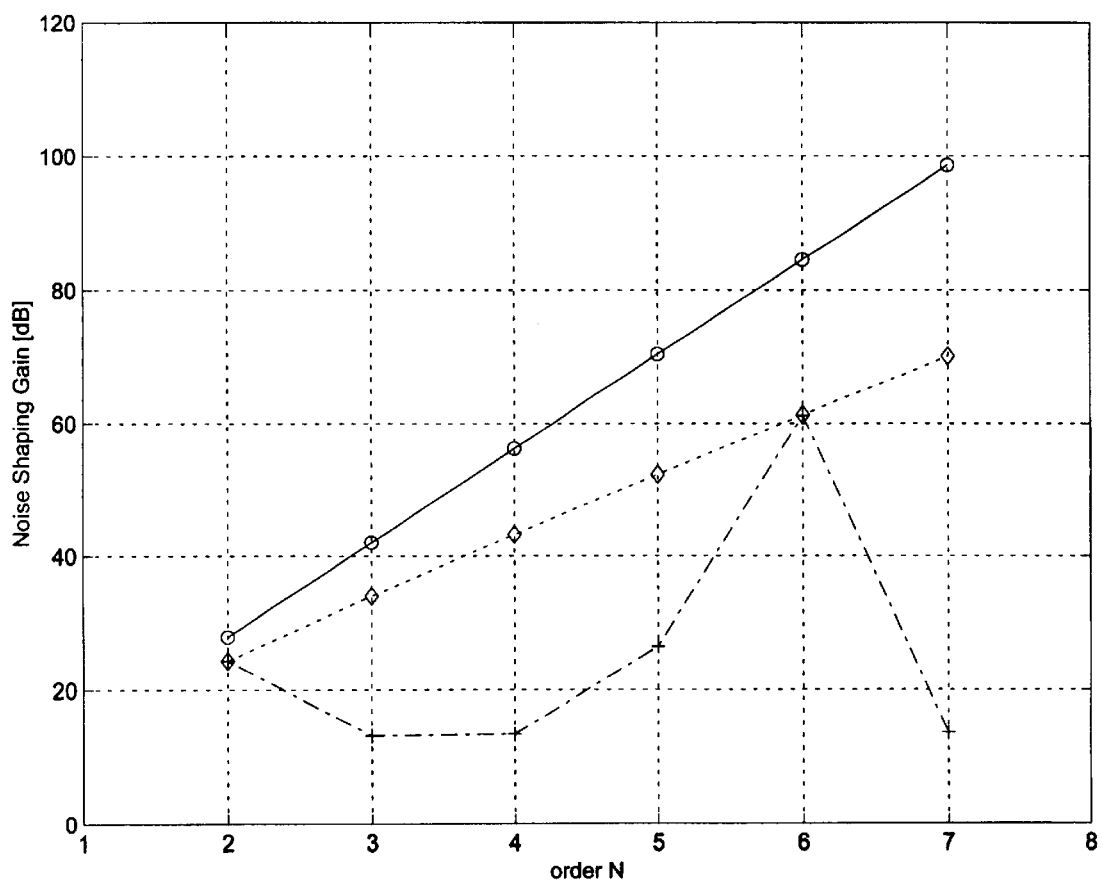
FIG. 16 is a graph showing a noise shaping gain of a second-order noise-shaping filter whose real coefficients are approximated to three decimal places by a binary number.

The below table 5 shows noise shaping gains of conventional second-order to seventh-order noise-shaping filters, noise shaping gains of optimum second-order to seventh-order noise-shaping filters, and noise shaping gains of second-order to seventh-order noise-shaping filters employing approximations by 2 bits, 3 bits, 4 bits and 16 bits. FIG. 15 is a graph showing a noise shaping gain of a second-order noise-shaping filter whose real coefficients are approximated to two decimal places by a binary number, and FIG. 16 is a graph showing a noise shaping gain of a second-order noise-shaping filter whose real coefficients are approximated to three decimal places by a binary number. From an item about a filter approximating an optimum filter (approximation by binary 2 bits) in the below table 5, an item about a filter approximating an optimum filter (approximation by binary 3 bits) in the table 5, and FIGS. 15 and 16, it can be seen that, for approximations of decimals by 2 bits and 3 bits, noise shaping gains are smaller than or almost equal to those of conventional noise-shaping filters. In other words, for real coefficients whose decimal places are approximated by 3 bits or less, there is no meaning in approximation. Thus, it is preferred to approximate real coefficients of noise-shaping filters by 4 bits or more.

TABLE 5

| | 2nd | 3rd | 4th | 5th | 6th | 7th |
|---|---|---|---|---|---|---|
| CONVENTIONAL FILTER (1) | 24.4 | 34.0 | 43.2 | 52.3 | 61.2 | 70.0 |
| PROPOSED OPTIMUM FILTER (2) | 27.9 | 42.0 | 56.1 | 70.3 | 84.5 | 98.6 |
| FILTER APPROXIMATING OPTIMUM FILTER * APPROXIMATION BY BINARY 2 BITS | 24.4 | 13.1 | 13.4 | 26.5 | 61.1 | 13.5 |
| FILTER APPROXIMATING OPTIMUM FILTER * APPROXIMATION BY BINARY 3 BITS | 22.3 | 39.6 | 19.0 | 33.0 | 32.1 | 20.0 |
| FILTER APPROXIMATING OPTIMUM FILTER * APPROXIMATION BY BINARY 4 BITS | 27.6 | 39.6 | 37.8 | 39.1 | 25.9 | 36.8 |
| FILTER APPROXIMATING OPTIMUM FILTER (3) * APPROXIMATION BY BINARY 16 BITS | 27.9 | 42.0 | 56.1 | 70.3 | 84.3 | 98.6 |
| (2)-(1) | 3.6 | 8.0 | 12.9 | 18.0 | 23.3 | 28.6 |
| (3)-(1) | 3.6 | 8.0 | 12.9 | 18.0 | 23.1 | 28.6 |

The lower part of the above table 5 shows a difference between a noise shaping gain of a conventional noise-shaping filter and a noise shaping gain of an optimum noise-shaping filter and a difference between the noise shaping gain of the conventional noise-shaping filter and a noise shaping gain of a noise-shaping filter approximating the optimum noise-shaping filter (approximation by binary 16 bits). It can be seen from such differences that the optimum noise-shaping filter exhibits a difference of 3 dB or more in all orders, which is a sufficiently significant difference for a human being to easily detect.

INDUSTRIAL APPLICABILITY

As apparent from the above description, the present invention provides a digital noise-shaping filter and a method for making the same, wherein respective coefficients of a noise transfer function of the noise-shaping filter are not simple integers, but appropriate real coefficients. Further, the digital noise-shaping filter is able to maximize noise suppression performance.

Further, according to the present invention, the digital noise-shaping filter shows excellent noise suppression performance over those of conventional noise-shaping filters in the same order. Therefore, this noise-shaping filter is stable in operation and excellent in noise suppression performance.

Further, according to this invention, the digital noise-shaping filter is more stable in operation than conventional noise-shaping filters under the condition that the same noise suppression performance is obtained.

Further, according to this invention, the digital noise-shaping filter has real coefficients approximating optimum values so that it can have almost the same performance as that of an optimum noise-shaping filter without increasing a calculation complexity.

Further, according to this invention, the digital noise-shaping filter has a lowest-order noise transfer function under the condition that the same noise suppression performance is obtained, resulting in an increase in system stability.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An input signal processing apparatus comprising:
   a digital noise-shaping filter for a delta-sigma data converter for performing a noise transfer function expressed by the following equation 1, said noise transfer function having real coefficients:

$$NTF(z) = -1 + a_1 z^{-1} + a_2 z^{-2} + \Lambda + a_N z^{-N} \qquad \text{[Equation 1]}$$

where, NTF(z) is a z-transform of said noise transfer function, $a_1, a_2, \ldots, a_N$ are said real coefficients of said noise transfer function, and N is an order of said noise-shaping filter.

2. The apparatus as set forth in claim 1, wherein said real coefficients of said noise transfer function are obtained by:
   1) defining an objective function enabling a quantitative evaluation of the performance of said noise-shaping filter;
   2) obtaining real coefficient conditions capable of optimizing said objective function; and
   3) mathematically calculating optimum real coefficients satisfying said real coefficient conditions.

3. The apparatus as set forth in claim 2, wherein said objective function is defined as the ratio of the amount of energy of quantization noise before being shaped to the amount of energy of quantization noise after being shaped, at a specific frequency band.

4. The apparatus as set forth in claim 2, wherein said objective function is expressed by the following equation 2:

$$NSG \equiv 10 \log_{10} \frac{P_{rq}}{P_{ns}} \qquad \text{[Equation 2]}$$

where, NSG is said objective function, $P_{ns}$ is power of energy $e_{ns}(n)$ of quantization noise before being shaped, and $P_{rq}$ is power of energy $e_{rq}(n)$ of quantization noise after being shaped.

5. The apparatus as set forth in claim 4, wherein a denominator in a logarithm of said objective function is expressed by the following equation 3 by:
   1) arranging said power $P_{ns}$ of the energy $e_{ns}(n)$ of the quantization noise before being shaped and said power $P_{rq}$ of the energy $e_{rq}(n)$ of the quantization noise after being shaped, on the basis of an oversampling ratio M and a minimum quantization scale $\Delta$; and
   2) substituting said equation 2 into the arranged objective function:

$$\int_{-\frac{\pi}{M}}^{\frac{\pi}{M}} |NTF(e^{i\omega})|^2 \, d\omega = (1 + a_1^2 + a_2^2 + a_3^2 + \Lambda a_N^2) 2 \frac{\pi}{M} + \qquad \text{[Equation 3]}$$

$$4(-a_1 + a_1 a_2 + a_2 a_3 + \Lambda a_{N-1} a_N) \sin \frac{\pi}{M} +$$

$$\frac{4}{2}(-a_2 + a_1 a_3 + a_2 a_4 + \Lambda a_{N-2} a_N) \sin 2 \frac{\pi}{M} +$$

$$\frac{4}{3}(-a_3 + a_1 a_4 + a_2 a_5 + \Lambda a_{N-3} a_N) \sin 3 \frac{\pi}{M} +$$

$$\Lambda + \frac{4}{(N-1)}(-a_{N-1} + a_1 a_N) \sin(N-1) \frac{\pi}{M} +$$

$$\frac{4}{N}(-a_N) \sin N \frac{\pi}{M} \equiv NSG^*.$$

6. The apparatus as set forth in claim 5, wherein said real coefficient conditions capable of optimizing said objective function are obtained by partially differentiating said equation 3 of said logarithm denominator of said objective function with respect to a real coefficient of each term and setting each real coefficient corresponding to the resulting extreme value as each real coefficient of said equation 1.

7. The apparatus as set forth in claim 6, wherein said optimum real coefficients satisfying said real coefficient conditions are elements of a matrix A expressed by the following equation 4:

$$A = G^{-1} B \qquad \text{[Equation 4]}$$

where, G is an order-N square matrix expressed by the following equation 5 and B is an order-N column vector whose elements are expressed by the following equation 6:

$$G = \{g_{ij}\}$$

$$= \begin{bmatrix} \frac{4\pi}{M} & \frac{4}{1}\sin\frac{\pi}{M} & \frac{4}{2}\sin\frac{\pi}{M} & \Lambda & \frac{4}{N-1}\sin\frac{(N-1)\pi}{M} \\ \frac{4}{1}\sin\frac{\pi}{M} & \frac{4\pi}{M} & \frac{4}{1}\sin\frac{\pi}{M} & \Lambda & \frac{4}{N-2}\sin\frac{(N-2)\pi}{M} \\ M & M & M & & M \\ \frac{4}{N-1}\sin\frac{(N-1)\pi}{M} & \frac{4}{N-2}\sin\frac{(N-2)\pi}{M} & \Lambda & & \frac{4\pi}{M} \end{bmatrix}$$

[Equation 5]

$$b_i = \frac{4}{i}\sin i\frac{\pi}{M}.$$

[Equation 6]

8. The apparatus as set forth in claim 2, wherein said real coefficients of said noise transfer function are values approximating said optimum real coefficients.

9. The apparatus as set forth in claim 8, wherein said approximate real coefficients are values approximated by a binary number.

10. The apparatus as set forth in claim 9, wherein said values approximated by said binary number are values approximated to four or more decimal places.

11. The apparatus as set forth in claim 10, wherein said values approximated by said binary number are said values approximated to four decimal places when the order of said noise-shaping filter is 2 or 3.

12. The apparatus as set forth in claim 11, wherein, for calculation of said noise transfer function of said equation 1, said values approximated to four or more decimal places are calculated by means of an adder or subtracter.

13. A method for making a digital noise-shaping filter for a delta-sigma data converter, said digital noise-shaping filter comprising a noise transfer function expressed by NTF(z)=−1+$a_1z^{-1}$+$a_2z^{-2}$+$\Lambda$+$a_Nz^{-N}$, said noise transfer function having real coefficients $a_1$, $a_2$, ... $a_N$, wherein said real coefficients of said noise transfer function are obtained by the steps of:

a) defining an objective function enabling a quantitative evaluation of the performance of said noise-shaping filter;

b) obtaining real coefficient conditions capable of optimizing said objective function; and c) mathematically calculating optimum real coefficients satisfying said real coefficient conditions.

14. The method as set forth in claim 13, wherein said objective function is expressed by the following equation 7:

$$NSG \equiv 10\log_{10}\frac{P_{rq}}{P_{ns}}$$

[Equation 7]

where, NSG is said objective function, $P_{ns}$ is power of energy $e_{ns}(n)$ of quantization noise before being shaped, and $P_{rq}$ is power of energy $e_{rq}(n)$ of quantization noise after being shaped.

15. The method as set forth in claim 14, wherein a denominator in a logarithm of said objective function is expressed by the following equation 8 by:

1) arranging said power $P_{ns}$ of the energy $e_{ns}(n)$ of the quantization noise before being shaped and said power $P_{rq}$ of the energy $e_{rq}(n)$ of the quantization noise after being shaped, on the basis of an oversampling ratio M and a minimum quantization scale Δ; and 2) substituting said equation 7 into the arranged objective function:

$$\int_{-\frac{\pi}{M}}^{\frac{\pi}{M}} |NTF(e^{j\omega})|^2 \, d\omega = (1 + a_1^2 + a_2^2 + a_3^2 + \Lambda a_N^2)2\frac{\pi}{M} +$$

$$4(-a_1 + a_1a_2 + a_2a_3 + \Lambda a_{N-1}a_N)\sin\frac{\pi}{M} +$$

$$\frac{4}{2}(-a_2 + a_1a_3 + a_2a_4 + \Lambda a_{N-2}a_N)\sin 2\frac{\pi}{M} +$$

$$\frac{4}{3}(-a_3 + a_1a_4 + a_2a_5 + \Lambda a_{N-3}a_N)\sin 3\frac{\pi}{M} +$$

$$\Lambda + \frac{4}{(N-1)}(-a_{N-1} + a_1a_N)\sin(N-1)\frac{\pi}{M} +$$

$$\frac{4}{N}(-a_N)\sin N\frac{\pi}{M} \equiv NSG^*.$$

[Equation 8]

16. The method as set forth in claim 15, wherein said real coefficient conditions capable of optimizing said objective function are obtained by partially differentiating said equation 8 of said logarithm denominator of said objective function with respect to a real coefficient of each term and setting each real coefficient corresponding to the resulting extreme value as each real coefficient of said noise transfer function.

17. The method as set forth in claim 16, wherein said optimum real coefficients satisfying said real coefficient conditions are elements of a matrix A expressed by the following equation 9:

$$A = G^{-1}B$$

[Equation 9]

where, G is an order-N square matrix expressed by the following equation 10 and B is an order-N column vector whose elements are expressed by the following equation 11:

$$G = \{g_{ij}\}$$

$$= \begin{bmatrix} \frac{4\pi}{M} & \frac{4}{1}\sin\frac{\pi}{M} & \frac{4}{2}\sin\frac{\pi}{M} & \Lambda & \frac{4}{N-1}\sin\frac{(N-1)\pi}{M} \\ \frac{4}{1}\sin\frac{\pi}{M} & \frac{4\pi}{M} & \frac{4}{1}\sin\frac{\pi}{M} & \Lambda & \frac{4}{N-2}\sin\frac{(N-2)\pi}{M} \\ M & M & M & & M \\ \frac{4}{N-1}\sin\frac{(N-1)\pi}{M} & \frac{4}{N-2}\sin\frac{(N-2)\pi}{M} & \Lambda & & \frac{4\pi}{M} \end{bmatrix}$$

[Equation 10]

$$b_i = \frac{4}{i}\sin i\frac{\pi}{M}.$$

[Equation 11]

18. The method as set forth in claim 13, wherein said real coefficients of said noise transfer function are values approximating said optimum real coefficients.

19. The method as set forth in claim 18, wherein said approximate real coefficients are values approximated to four or more decimal places by a binary number.

20. The method as set forth in claim 19, wherein said values approximated by said binary number are said values approximated to four decimal places when the order of said noise-shaping filter is 2 or 3.

21. The method as set forth in claim 20, wherein, for calculation of said noise transfer function, said values approximated to four or more decimal places by the binary number are calculated by means of an adder or subtracter.

* * * * *